United States Patent
Ciraldo et al.

(10) Patent No.: US 12,371,815 B2
(45) Date of Patent: *Jul. 29, 2025

(54) DIAMONDS AND HETERO-EPITAXIAL METHOD OF FORMING DIAMONDS

(71) Applicant: Advanced Diamond Holdings, LLC, Beltsville, MD (US)

(72) Inventors: John P. Ciraldo, Chicago, IL (US); Jonathan Levine-Miles, Chicago, IL (US)

(73) Assignee: Advanced Diamond Holdings, LLC, Beltsville, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/426,526

(22) Filed: Jan. 30, 2024

(65) Prior Publication Data

US 2024/0401232 A1 Dec. 5, 2024

Related U.S. Application Data

(63) Continuation of application No. 17/518,360, filed on Nov. 3, 2021, now Pat. No. 11,905,619, which is a
(Continued)

(51) Int. Cl.
 *C30B 29/04* (2006.01)
 *C30B 25/12* (2006.01)
 (Continued)

(52) U.S. Cl.
 CPC .............. *C30B 25/22* (2013.01); *C30B 25/12* (2013.01); *C30B 29/04* (2013.01); *C30B 29/68* (2013.01)

(58) Field of Classification Search
 CPC ......... C30B 29/04; C30B 29/68; C30B 25/22; C30B 25/12; C30B 33/08
 See application file for complete search history.

(56) References Cited

U.S. PATENT DOCUMENTS

| 5,443,032 A | 8/1995 | Vichr et al. |
| 7,598,107 B1 | 10/2009 | Liu et al. |

(Continued)

FOREIGN PATENT DOCUMENTS

| CN | 102014551 A | 4/2011 |
| CN | 102031561 A | 4/2011 |

(Continued)

OTHER PUBLICATIONS

Extended European Search Report for Application No. 18853492.9, dated May 18, 2021, 6 pages.
(Continued)

*Primary Examiner* — Robert M Kunemund
(74) *Attorney, Agent, or Firm* — Nutter McClennen & Fish LLP

(57) ABSTRACT

A method of forming a plurality of diamonds provides a base, epitaxially forms a first sacrificial layer on the base, and then epitaxially forms a first diamond layer on the first sacrificial layer. The first sacrificial layer has a first material composition, and the first diamond layer is a material that is different from the first material composition. The method then epitaxially forms a second sacrificial layer on the first diamond layer, and epitaxially forms a second diamond layer on the second sacrificial layer. The second sacrificial layer has the first material composition. The base, first and second sacrificial layers, and first and second diamond layers form a heteroepitaxial super-lattice.

22 Claims, 5 Drawing Sheets

Related U.S. Application Data continuation of application No. 16/811,926, filed on Mar. 6, 2020, now Pat. No. 11,198,950, which is a continuation of application No. PCT/US2018/050061, filed on Sep. 7, 2018.

(60) Provisional application No. 62/555,765, filed on Sep. 8, 2017.

(51) Int. Cl.
*C30B 25/22* (2006.01)
*C30B 29/68* (2006.01)

(56) References Cited

U.S. PATENT DOCUMENTS

| | | | |
|---|---|---|---|
| 8,853,060 | B1 | 10/2014 | Lai et al. |
| 10,832,954 | B2 | 11/2020 | Frougier et al. |
| 11,198,950 | B2 * | 12/2021 | Ciraldo ............... C23C 16/01 |
| 11,905,619 | B2 * | 2/2024 | Ciraldo ............... C30B 25/22 |
| 2009/0176114 | A1 | 7/2009 | Sawabe et al. |
| 2010/0015438 | A1 | 1/2010 | Williams et al. |
| 2010/0078729 | A1 | 4/2010 | Fukutome et al. |
| 2010/0178719 | A1 | 7/2010 | Sung |
| 2011/0081531 | A1 | 4/2011 | Noguchi |
| 2011/0084285 | A1 | 4/2011 | Noguchi |
| 2015/0279894 | A1 | 10/2015 | Cheng et al. |

FOREIGN PATENT DOCUMENTS

| | | |
|---|---|---|
| CN | 102041551 A | 5/2011 |
| CN | 104651928 A | 5/2015 |
| CN | 106835274 A | 6/2017 |
| CN | 107268076 A | 10/2017 |
| EP | 2009135 A1 | 12/2008 |
| EP | 3178971 A1 | 6/2017 |
| JP | H0769795 A | 3/1995 |
| JP | 2011011942 A | 1/2011 |
| JP | 2011079683 A | 4/2011 |
| WO | 2019051299 A1 | 3/2019 |

OTHER PUBLICATIONS

First Office Action (OA) issued by the China National Intellectual Property Administration (CNIPA) dated Oct. 8, 2021, 28 pages.

International Searching Authority—International Search Report and Written Opinion for International Application No. PCT/US2018/050061, dated Nov. 19, 2018, 12 pages.

Salgueiredo, E., et al., "Self-mated tribological systems based on multilayer micro/nanocrystalline CVD diamond coatings," Wear vol. 303, Issues 1-2, 2013, pp. 225-234.

Tang, M., et al. "Valence band offsets of the strained and longitudinally relaxed diamond/c-BN superlattices" J Shanghai Univ (engl Ed) 2011 15(3) 218-222.

* cited by examiner

DIAMONDS AND HETERO-EPITAXIAL METHOD OF FORMING DIAMONDS

PRIORITY

This patent application is a continuation of U.S. patent application Ser. No. 17/518,360, filed Nov. 3, 2021 now U.S. Pat. No. 11,905,619, which is a continuation of U.S. patent application Ser. No. 16/811,926 filed Mar. 6, 2020 now U.S. Pat. No. 11,198,950, entitled, "DIAMONDS AND HETERO-EPITAXIAL METHODS OF FORMING DIAMONDS," which is continuation of PCT patent application no. PCT/US2018/050061, filed Sep. 7, 2018, entitled, "DIAMONDS AND HETERO-EPITAXIAL METHODS OF FORMING DIAMONDS," which in turn claims priority from provisional U.S. patent application No. 62/555,765, filed Sep. 8, 2017, entitled, "HETERO-EPITAXIAL METHOD OF FORMING A FILM OR LAYER OF MATERIAL," and naming John P. Ciraldo and Jonathan Levine-Miles as inventors, the disclosures of which are incorporated herein, in their entireties, by reference.

FIELD OF THE INVENTION

The invention generally relates to epitaxially forming films and layers and, more particularly, the invention relates to a super-lattice formed of films and/or layers.

BACKGROUND OF THE INVENTION

Diamond wafers are used in a wide variety of applications. For example, they can be used for producing integrated circuits, or as lenses for laser systems.

Fabricating diamond wafers, however, can produce a number of technical challenges.

SUMMARY OF VARIOUS EMBODIMENTS

In accordance with one embodiment of the invention, a method of forming a plurality of diamonds provides a base, epitaxially forms a first sacrificial layer on the base, and then epitaxially forms a first diamond layer on the first sacrificial layer. The first sacrificial layer has a first material composition, and the first diamond layer is a material that is different from the first material composition. The method then epitaxially forms a second sacrificial layer on the first diamond layer, and epitaxially forms a second diamond layer on the second sacrificial layer. The second sacrificial layer has the first material composition. The base, first and second sacrificial layers, and first and second diamond layers form a heteroepitaxial super-lattice.

The first and second sacrificial layers may be single crystal. After the layers are formed, the first and second diamond layers may be separated from the first and second sacrificial layers to produce free standing, single crystal diamonds. To that end, the layers may be separated using a wet etch that etches away at least a portion of the first material.

The first material that forms the sacrificial layers may include iridium and/or titanium. The base may include one or more of magnesium oxide, iridium, silicon, silicon carbide, or diamond.

The first diamond layer may have a thickness of between about 10 and 1000 microns. The method may provide a substrate holder that limits the width of the epitaxially formed diamond layers. Furthermore, the base may be provided within a cavity of the substrate holder.

Among other ways, the first sacrificial layer may be epitaxially formed using atomic-layer deposition, physical vapor deposition, and/or chemical vapor deposition.

In accordance with another embodiment, a heteroepitaxial super-lattice has a base formed from a base material composition, a first sacrificial layer on the base, and a first diamond layer on the first sacrificial layer. The first sacrificial layer is epitaxially formed using the crystal structure of the base and has a first material composition. In a corresponding manner, the first diamond layer is epitaxially formed using the crystal structure of the first sacrificial layer and is a material that is different from the first material composition. The super-lattice also has a second sacrificial layer on the first diamond layer, and a second diamond layer on the second sacrificial layer. The second sacrificial layer has the first material composition, and, in a manner similar to the first diamond layer, the second diamond layer is formed from a material that is different from the first material composition.

In accordance with other embodiments, another method of forming a plurality of diamonds provides a substrate holder with a cavity containing a base having a base material composition. Next, the method epitaxially forms a first sacrificial layer on the base and within the cavity, and then epitaxially forms a first diamond layer on the first sacrificial layer within the cavity. The first sacrificial layer has a first material composition, and the first diamond layer is formed from a material that is different from the first material composition. The method continues by epitaxially forming a second sacrificial layer on the first diamond layer within the cavity, and then epitaxially forming a second diamond layer on the second sacrificial layer within the cavity. The second sacrificial layer is formed from the first material composition. In the end, the base, first and second sacrificial layers, and first and second diamond layers form a heteroepitaxial super-lattice.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments produce diamond wafers (also referred to as diamond films, and/or diamond layers) by depositing a sacrificial layer (a/k/a "substrate" layer) on a base, and a first diamond layer on the sacrificial layer. A second sacrificial layer then may be formed on the first diamond layer, and a second diamond layer may be formed on the second sacrificial layer. This process may be repeated to form periodic layers of sacrificial and diamond materials, producing a super-lattice. Some embodiments control production by forming the super-lattice within the cavity of a substrate holder. The walls of the substrate holder effectively limit the size of the cavity and thus, the width of the epitaxially formed layers. Those skilled in the art can modify the substrate holder to produce diamond layers having desired dimensions and shapes (e.g., 2-10 inches in diameter if a rounded shape). Details of illustrative embodiments are discussed below.

Figure 1:
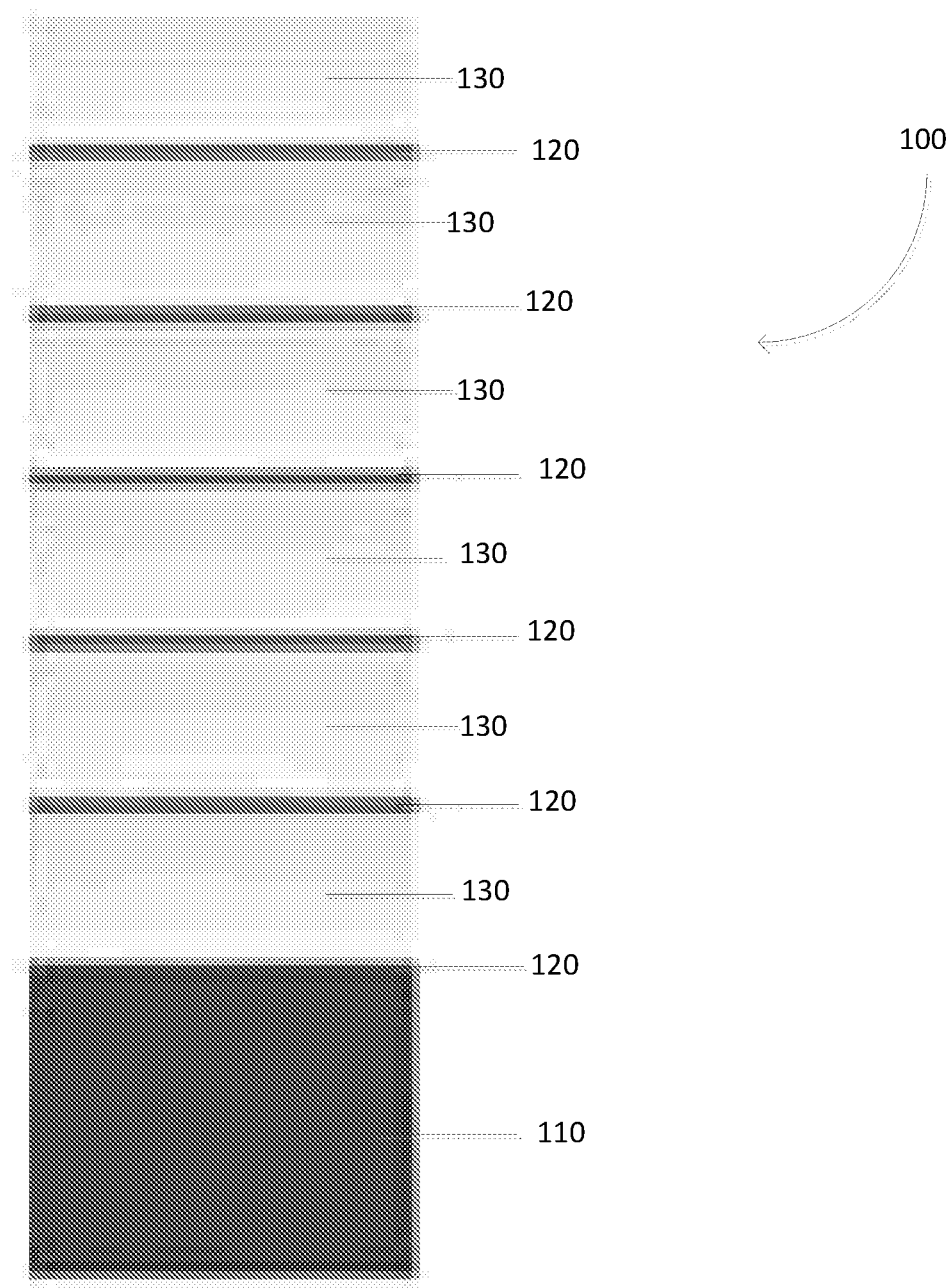
FIG. 1 schematically shows a super-lattice, in accordance with illustrative embodiments of the invention.

FIG. 1 schematically shows a super-lattice 100, which, as known by those in the art, is a periodic structure of alternating layers of two or more different materials. In illustrative embodiments, the super-lattice 100 has a base 110, and periodic/repeating layers of sacrificial layer 120 and diamond layer 130. The layers 120 and 130 preferably are epitaxially deposited, e.g., heteroepitaxially deposited.

Each sacrificial layer 120 includes one or more sacrificial material layers. For example, the sacrificial layer 120 may include a top sacrificial material layer onto which a diamond layer 130 is formed, and one or more sacrificial material layers underlying the top sacrificial material layer. Some embodiments may use these additional sacrificial layers 120 to facilitate wafer separation. Additionally, or alternatively, the sacrificial layer 120 may include a sandwich of substrate material, e.g., iridium-magnesium oxide-iridium. Moreover, there is no requirement that every sacrificial layer 120 be identical.

The sacrificial layer 120 may comprise a material composition, such as, iridium as the sole or top sacrificial material layer for the purpose of heteroepitaxial deposition of the diamond layer 130 in a super-lattice structure 100. It should be noted that, while iridium has been identified as a possible material for the sacrificial layer 120, illustrative embodiments could be formed with other materials in place of, or in combination with, the iridium. For example, the sacrificial layer 120 may include titanium. Accordingly, discussion of a specific material, such as iridium, is for illustrative purposes and not intended to limit various embodiments.

The material(s) used in the sacrificial layer 120 (e.g., top sacrificial layer 120) may be single crystal, with suitable lattice parameters. In some embodiments, a material of the sacrificial layer 120 may possess properties that allow the material to be selectively etched with respect to the diamond layer 130. Alternative embodiments may implement the sacrificial layer 120 as a sacrificial material that is polycrystalline.

The base 110 and/or the sacrificial layers 120 may be formed from stacked material layers (e.g., a series of thin films, each of a different material). The stacked material layers may facilitate epitaxial deposition. To that end, a series of material layers may be deposited, and each stacked material layer may reduce or expand the lattice parameters to facilitate the growth of single crystal diamond layer 130 on a material that is not well lattice-matched with the diamond. For example, to deposit diamond (lattice constant=3.57 Angstroms) on silicon (lattice constant=5.43 Angstroms), a first intermediate material that has a lattice constant slightly smaller than silicon may be grown on the silicon layer, then a second intermediate material with an even smaller lattice constant may be deposited on the first intermediate material, and so on, until the surface possesses a lattice constant that is suitable for diamond. Diamond may then be deposited on the last intermediate layer. In addition, one or more of the intermediate layers may include a diffusion barrier layer configured to prevent and/or minimize the intermixing of elements between two adjacent layers.

In illustrative embodiments, the process provides an iridium substrate layer 120 (e.g., sacrificial layer 120). In that case, the substrate 120 may be in the form of a single-crystal iridium film applied to a substrate of some other substrate layer 120 material (referred to herein as a "foreign substrate"), which may be, for example, magnesium oxide (MgO). However, the single-crystal iridium film 120 may be applied to any single-crystal foreign substrate material with suitable lattice characteristics for the epitaxial deposition of iridium. The iridium film 120 may be deposited on the foreign substrate via atomic-layer deposition (ALD) or other technique, such as, for example, physical vapor deposition ("PVD") or chemical vapor deposition ("CVD") techniques. Thus, for example, the foreign substrate may be formed on the base 110 and the iridium film may be formed on the foreign substrate, where the foreign substrate and the iridium film together form the substrate 120. In some instances, the iridium layer may be formed without an underlying foreign substrate, in which case the iridium film forms the substrate layer 120.

In any case, the iridium substrate 120 may then be utilized as a substrate for the growth of the single crystal diamond layer 130, typically by plasma-enhanced chemical vapor deposition (PECVD), although other techniques may be used, such as, for example, atomic layer deposition. Some embodiments may pre-seed the diamond growth by the application of diamond crystallites. Illustrative embodiments may also employ modifications to the CVD growth of diamond initially, such as through ion bombardment or substrate biasing, in order to initiate the diamond growth while suppressing the formation of other carbon allotropes, as well as maintaining single crystal diamond structure.

After the single-crystal diamond layer 130 has been deposited onto the iridium 120 for long enough to achieve the desired thickness (e.g., 10-1000 microns), an additional sacrificial layer 120 may be formed on the diamond layer 130 as described above. This new sacrificial layer 120 may be used as a substrate for the epitaxial growth of an additional diamond material layer. The process may continue iteratively until the desired number, "n," of diamond layers 130 has been created. In some embodiments, the end product will be a "super-lattice," which, as known by those in the art, is formed of several layers in the form ABCBCBCBC . . . , where A is the base 110, B is the sacrificial layer 120 (e.g., single-crystal sacrificial layer 120) and C is the diamond layer 130 (e.g., single-crystal diamond layer 130). The stack may be described as $A[BC]_n$, where n denotes the desired number of layers of diamond.

Figure 2A:
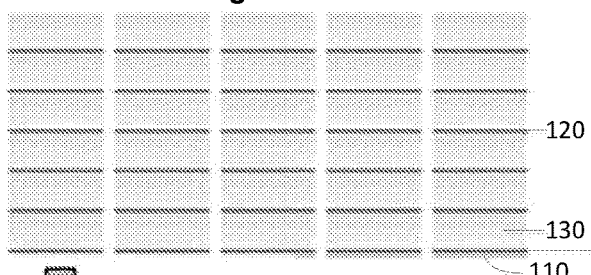
FIGS. 2A-2C schematically show the selective removal of the diamond layers from the sacrificial layers, in accordance with illustrative embodiments of the invention.
Figure 2B:
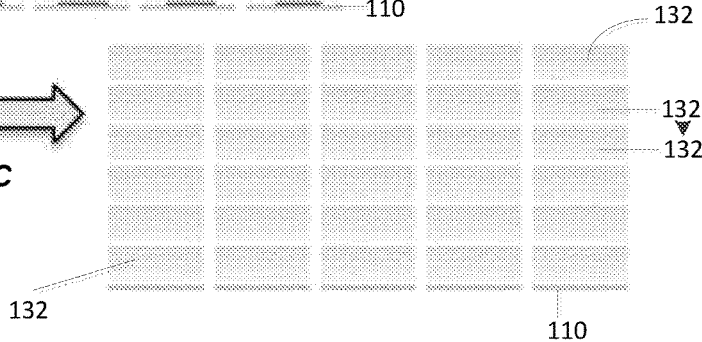
Figure 2C:
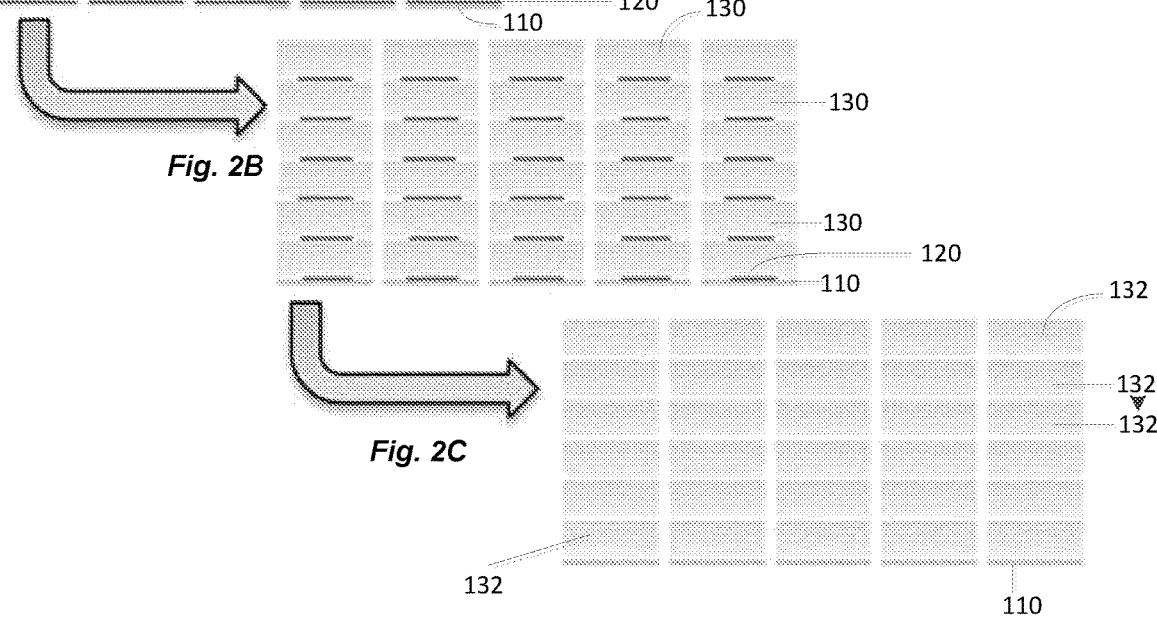

FIGS. 2A-2C schematically show a selective removal process for isolation of the diamond layer 130 from the super-lattice 100. After the complete stack/super-lattice 100 has been fabricated, it may be subjected to a decomposition process, wherein the diamond film(s) 130 are isolated from the sacrificial layer(s) 120, resulting in free standing, single-crystal diamond films/substrates 132. In some embodiments, multiple stacks may be formed simultaneously and/or subjected to a decomposition process simultaneously. As shown, FIG. 2A schematically shows the super-lattices 100 before separation/release steps. FIG. 2B schematically shows the super-lattices 100 with a portion of their sacrificial layers 120 removed, while FIG. 3C schematically shows the substrates 120 fully removed in such a manner to produce a plurality of diamond substrates/films.

While illustrative embodiments describe producing isolated single-crystal diamond films 132 (substrates), other embodiments may produce polycrystalline diamond substrates 130 as well, such as may be used for diamond windows or thermal spreaders. In embodiments with polycrystalline diamond substrates 130, the process preferably is similar to what is described above, but domain formation will be allowed to occur both in the diamond films and in the sacrificial layers 120.

It should be noted that although the diamond films 130 described herein are referred to as "films," in practice the material may be sufficiently thick as to function as freestanding rigid substrates and/or wafers once isolated/separated from the sacrificial layers 120. However, there may likewise be applications where the diamond is made much thinner in order to be used as laminates, for example in thermal and tribological applications.

Figure 3:
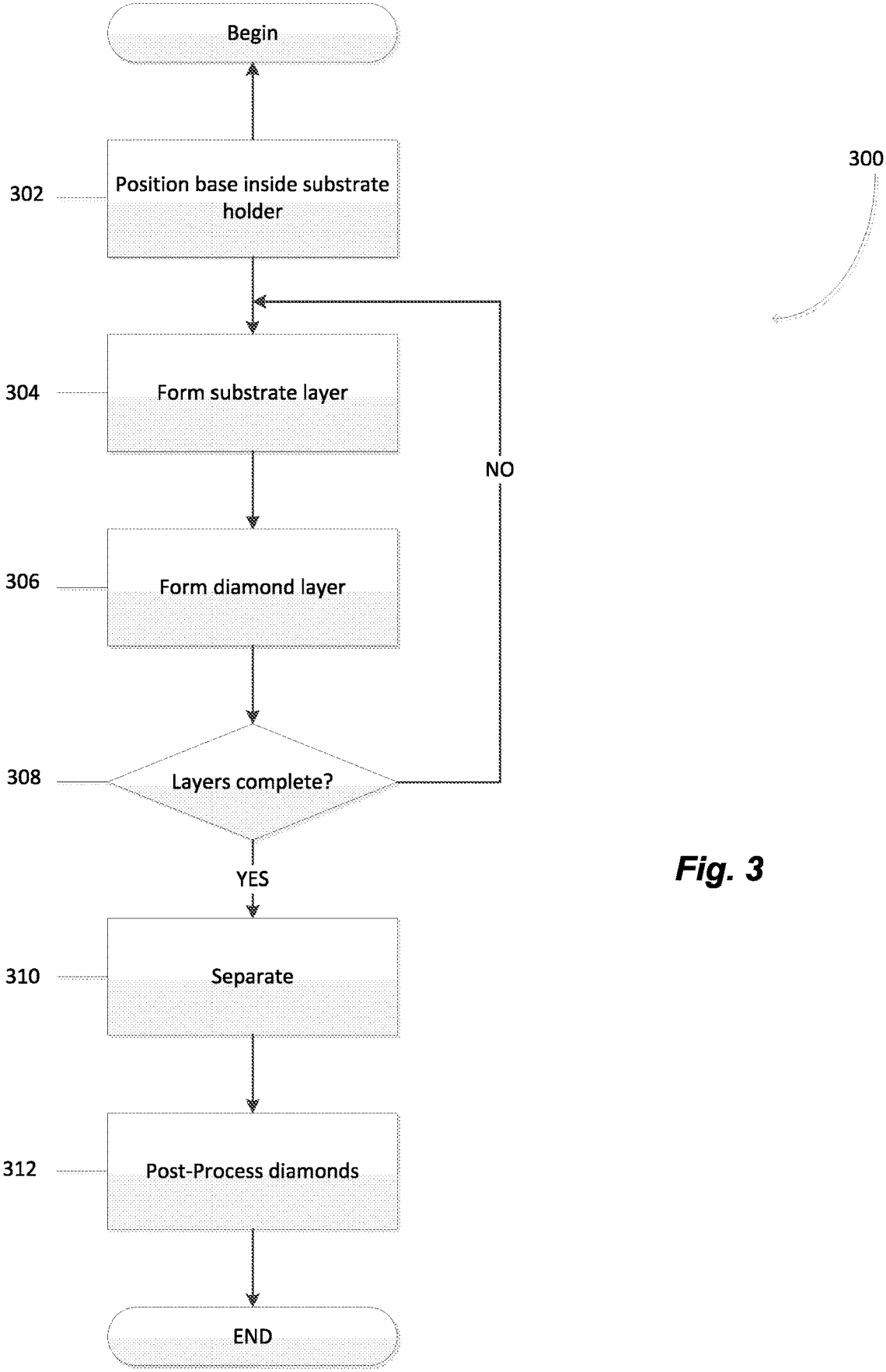
FIG. 3 is a flowchart schematically illustrating a process of forming diamond layers, in accordance with one exemplary embodiment of the invention.

FIG. 3 shows a process 300 of forming the diamond layers 130 in accordance with one exemplary embodiment of the invention. It should be noted that this method is substantially simplified from a longer process that may normally be used. Accordingly, the method of FIG. 3 may have many other steps that those skilled in the art likely would use. In addition, some of the steps may be performed in a different order than that shown, or at the same time. Those skilled in the art therefore can modify the process as appropriate.

Moreover, as noted above and below, many of the materials and structures noted are but one of a wide variety of different materials and structures that may be used. Those skilled in the art can select the appropriate materials and structures depending upon the application and other constraints. Accordingly, discussion of specific materials and structures is not intended to limit all embodiments.

Figure 4A:
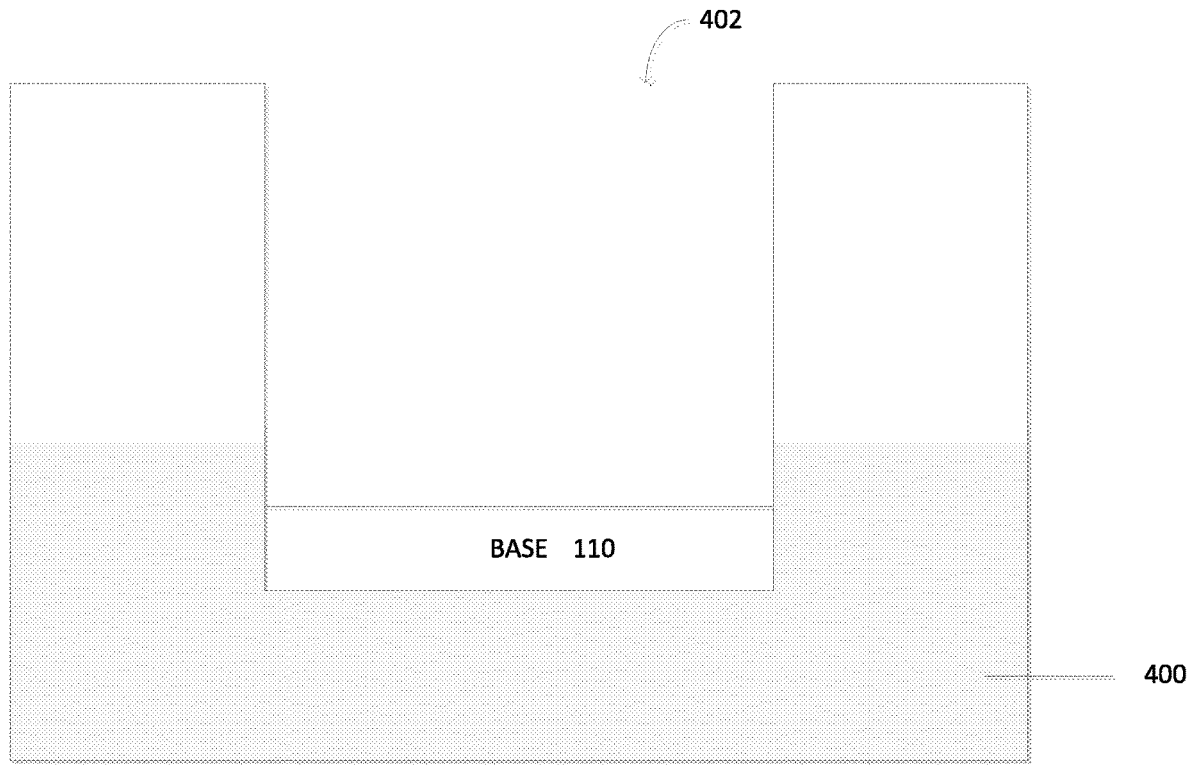
FIGS. 4A-4D schematically show the growth of diamond layers inside a substrate holder, in accordance with illustrative embodiments of the invention.

In preferred embodiments, the process is executed inside a furnace or other device (not shown) having a chamber with carefully controlled environmental conditions, such as prescribed pressures, temperatures, and environmental gasses. The process begins at step 302, which positions the base 110 inside the cavity 402 of a substrate holder 400 within the chamber. FIG. 4A schematically shows the base 110 positioned inside the substrate holder 400, in accordance with illustrative embodiments of the invention. Illustrative embodiments may package the base 110 already positioned inside the substrate holder 400. Among other things, the base 110 may be formed from, for example, magnesium oxide, iridium, silicon, silicon carbide diamond, or combinations thereof. Those skilled in the art may select yet a different material for the base 110. Preferably, the base 110 has a single crystal/monocrystalline structure.

Among other things, the substrate holder 400 may be formed from, for example, refracted metal such as molybdenum, and its cavity 402 functions as a template for the deposited layers (e.g., diamond layers 130). Accordingly, the cavity 402 may limit the dimensions (e.g., length and width) of the deposited layers in a prescribed manner as required by an application for the ultimately formed diamond layers 130. The cavity may be shaped in a prescribed manner (e.g., rectangular, circular, triangular, irregularly/specially shaped, etc.) as required by the anticipated applications/uses of the ultimately formed diamond layers 130. For example, in some embodiments, the cavity 402 may be 1 inch by 1 inch. As such, this cavity 402 would form a square diamond layer 130 having longest dimensions of 1 inch by 1 inch. In other embodiments, the cavity may be circular with a 6 inch diameter. Illustrative embodiments for circular/elliptically shaped diamond layers 130 may have diameters of 1-10 inches (e.g., 2-10 inches (e.g., 4 inches), 2-6 inches, 2-8 inches, 4-8 inches, 6-8 inches, etc.) Another benefit of the substrate holder 400 is its ability to grow the diamond in the vertical direction, while preventing growth along other directions.

After the base 110 is positioned and/or formed in the substrate holder, step 304 epitaxially forms a sacrificial layer 120 on the base 110. Among other ways, illustrative embodiments may use atomic layer deposition, or other vapor chemical deposition technique. Those skilled in the art may use still other known techniques to form the sacrificial layer 120. The sacrificial layer 120 preferably is constructed and formed from a material that may be more easily removed by subsequent wafer separation techniques (discussed below). Those skilled in the art therefore should engineer the sacrificial layer 120 based on the anticipated separation technique to separate the ultimately formed heteroepitaxial super-lattice 100.

Figure 4B:
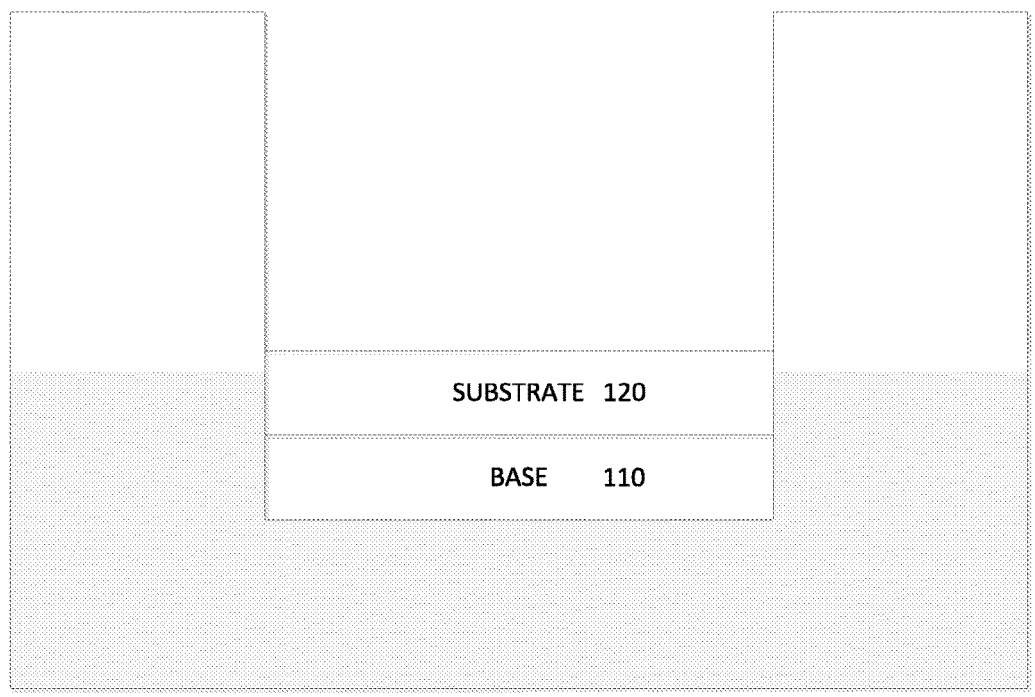

FIG. 4B schematically shows this sacrificial layer 120 (referred to in the figure as "substrate 120") deposited on the base 110, in accordance with illustrative embodiments of the invention. Epitaxial deposition causes the deposited sacrificial layer 120 to take on the crystallinity of the underlying base 110, which, in illustrative embodiments, is monocrystalline (also referred to as "single-crystal"). As noted above, the sacrificial layer 120 may be a metal, such as single-crystal iridium or titanium. As also noted above, the sacrificial layer 120 may be comprised of a plurality of different materials and/or layers to facilitate separation of the ultimately formed diamond layers 130.

Figure 4C:
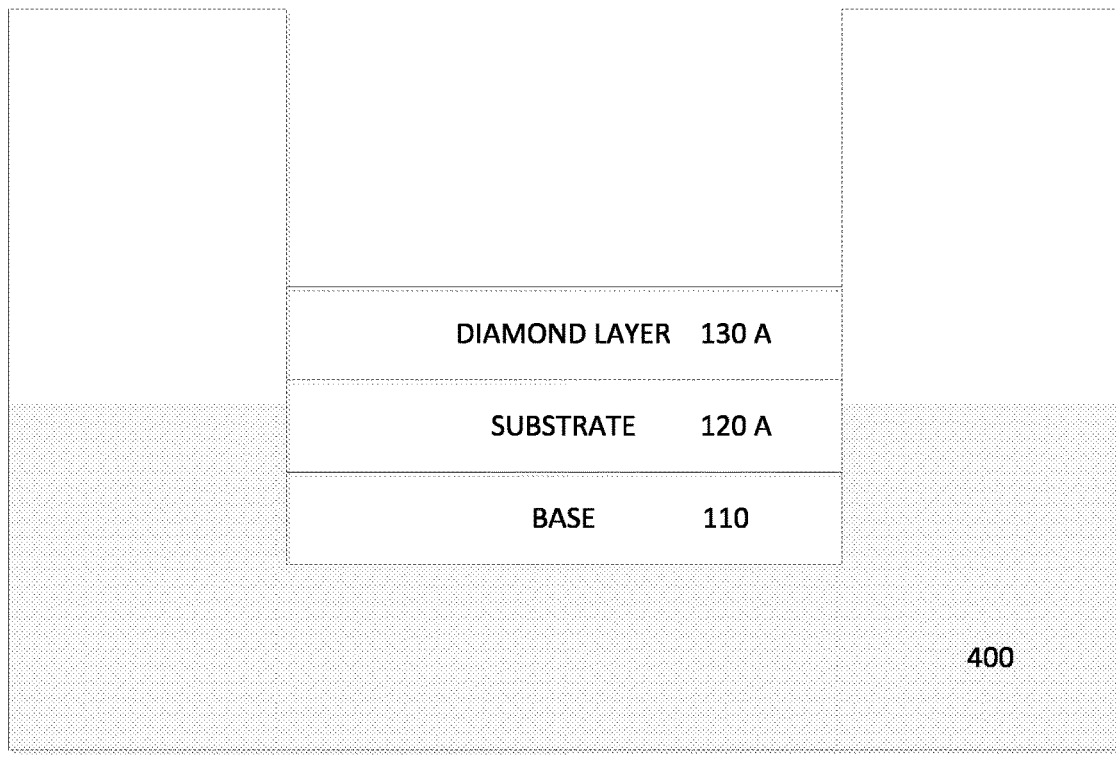

Next, after forming the first sacrificial layer 120, step 306 forms the first diamond layer 130 on the sacrificial layer 120. Again, this step may use conventional deposition techniques to form or deposit this and other diamond layers 130. FIG. 4C identifies the first substrate using reference number "120A", while identifying this first diamond layer using reference number "130A." In some embodiments, one or more of the following gases may be added into the chamber to help the growth rate: nitrogen, chlorine, oxygen, fluorine, argon, ammonia, carbon monoxide, carbon dioxide, fluorinated gas (e.g., xenon difluoride ($XeF_2$), sulfur hexafluoride ($SF_6$), or chlorodifluoromethane ($CHClF_2$)), boron containing gas (e.g., borazine ($B_3H_6N_3$), diborane ($B_2H_6$), or boron trichloride ($BCl_3$)), and hydrocarbons other than methane (e.g., butane, ethane, or propane). Accordingly, the first diamond layer 130A is epitaxially formed on the first sacrificial layer 120A, which causes the diamond layer 130A to be a single-crystal layer.

During growth using CVD processes, for example, it may be helpful to initially modify diamond growth to initiate diamond growth while suppressing formation of other carbon allotropes, as well as crystal domains. To that end, among other things, the process may use ion bombardment or substrate biasing at this point in the process.

During epitaxy, the diamond layer 130 and/or the sacrificial layer 120 may experience strain. In fact, some embodiments may be engineered so that the sacrificial layer 120 is strained more than the diamond layer 130. Generally, strained material is easier remove in a subsequent etching process or other related process. Furthermore, engineering strain on the sacrificial layer 120 may also remove or mitigate some strain from the diamond layer 130, thus reducing the number of defects in the diamond layer 130.

To expedite the process, various embodiments may use two separate growth chambers-one for adding the sacrificial layer 120 and another for forming the diamond layer 130 on the sacrificial layer 120. Specifically, during fabrication, one set of substrate holders 402 (e.g., one substrate holder 402 or a plurality of substrate holders 402) with either an exposed sacrificial layer 120 (or base 110) or exposed diamond layer 130 may be positioned in a chamber that is configured to deposit the substrate layer 120 only. At the same time or at a later time, a second set of substrate holders 402 (e.g., one substrate holder 402 or a plurality of substrate holders 402) with an exposed sacrificial layer 120 may be positioned in another chamber configured to deposit the diamond layer 130 only. After each chamber completes depositing its respective layer, an operator and/or a robotic arm may swap the substrate holders from one chamber to the other to receive the complimentary layer. More particularly, the substrate holders 402 in the substrate deposition chamber(s) may be moved to the diamond deposition chamber(s). Likewise, the substrate holders 402 in the diamond deposition chamber(s) also may be moved to the sacrificial layer deposition chamber(s). This switching process may repeat until the overall process finishes forming all of the desired layers.

Figure 4D:
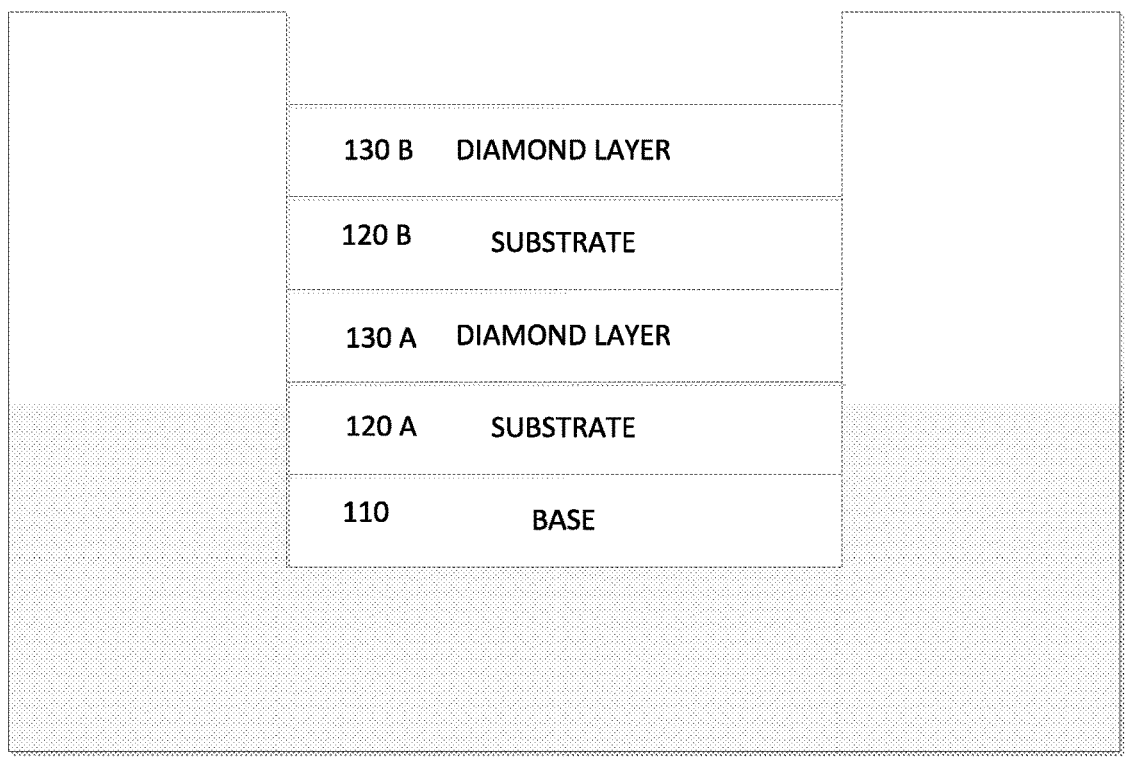

Accordingly, step 308 determines if all the desired diamond layers 130 are formed on the super-lattice 100. If not, then the process returns back to step 304, and epitaxially forms a second sacrificial layer 120B on the first diamond layer 130A. The process then continues to step 306 to epitaxially form a second diamond layer 130B on the second sacrificial layer 120B. FIG. 4D schematically shows this second diamond layer 130B formed on the second sacrificial layer 120B in accordance with illustrative embodiments of the invention. The process then returns to step 308, and thus, repeatedly epitaxially forms periodic layers of substrate-diamond as desired. For example, this process may form 2-100 diamond layers 130, such as 10-90 diamond layers 130, 20-80 diamond layers 130, 50-70 diamond layers 130, etc.

By performing this iterative process, illustrative embodiments heteroepitaxially form a diamond/sacrificial super-lattice 100 that may be used to produce individual diamond wafers. This process favorably enables those in the art to produce larger diamond wafers than those formed using conventional homoepitaxial processes known to the inventors. For example, homoepitaxial processes known to the inventors typically can be no larger than about 1 inch in diameter absent mosaicking or other similar undesirable processes.

If the process has formed the desired number of diamond layers 130, then step 310 separates the diamond layers 130 from the sacrificial layers 120 to form a plurality of free-standing, single crystal diamond substrates/films 132. Illustrative embodiments may use one or more conventional separation processes, such as chemical, thermal, vapor, and dry etching processes. In some embodiments, an acid bath separates the diamond layers 130. For example, the process may use a hot aqua regia to etch the sacrificial layers 120 and separate the diamond layers 130. Other types of acid baths may also be used with chemistries specifically chosen to etch the specific material(s) forming the sacrificial layers 120. For example, certain chemical etching processes may use hydrofluoric acid (HF) or xenon difluoride (XeF2). Indeed, those skilled in the art may select other appropriate separation techniques and thus, the noted techniques are illustrative and not intended to be limiting to all embodiments.

In some embodiments, the super-lattice 100 may be packaged and shipped to a remote site before the diamond layers 130 are separated. The diamond layers 130 can then be separated at the remote site to reduce the risk of damage during shipping.

As noted above, FIGS. 2A-2C schematically show the selective removal of the diamond layers 130 from the sacrificial layers 120. In FIG. 2B, the sacrificial layer 120 is partially etched. In FIG. 2C, the sacrificial layer 120 is not etched from the diamond wafers/films, which in this figure now are identified by reference number "132." The base 110 is shown as being left over after the selective removal process. Alternatively, or additionally, in some embodiments, a portion of the sacrificial layer 120 may be left over after the selective removal process. For example, the substrate 120 may be formed from single-crystal iridium film applied to a substrate of some other material, which may be, for example, magnesium oxide. The magnesium oxide substrate may be left over after the removal process.

It should be understood that although the substrate holder 400 is shown as having a single cavity 402, in some embodiments the substrate holder 400 may have multiple cavities 402. Each cavity 402 preferably is sized to produce the desired dimensioned layers. The substrate holder 400 may contain multiple identically sized and shaped cavities 402, or multiple differently sized and/or shaped cavities 402 (e.g., one round cavity and another rectangular cavity). Accordingly, for efficiency purposes and to reduce costs of manufacture/fabrication, illustrative embodiments form multiple super-lattices 100 at generally the same time, and each super-lattice 100 forms multiple diamond layers 130.

The process concludes at step 312, which post processes the diamond wafers 132. For example, the process may polish or anneal one or both sides of the resulting diamonds 132 depending on their ultimate application. For example, one side of the diamond wafers 132 may be polished, and/or the diamond wafers 132 may be doped for some downstream application. Other post-process may cut the diamond wafers 132 into prescribed sizes or shapes.

Accordingly, recognizing shortcomings of other diamond substrate production methods, such as homoepitaxial growth techniques, the inventors developed an efficient way to fabricate synthetic diamonds (i.e., non-natural diamonds). Using heteroepitaxial processes to form the super-lattice 100 enables significant flexibility in forming diamond wafers of larger sizes and desired shapes for a wide variety of applications.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a plurality of diamonds, the method comprising:
   providing a base;
   epitaxially forming a first sacrificial layer on the base, the first sacrificial layer having a first material composition;
   epitaxially forming a first diamond layer on the first sacrificial layer, the first diamond layer being a material that is different from the first material composition;
   epitaxially forming a second sacrificial layer on the first diamond layer, the second sacrificial layer comprising the first material composition; and
   the first sacrificial layer, and the first diamond layer defining repeating layers of a heteroepitaxial super-lattice, wherein the first diamond layer is configured to be separable from the first sacrificial layer.

2. The method as defined by claim 1 further comprising epitaxially forming a second diamond layer on the second sacrificial layer.

3. The method as defined by claim 2 further comprising separating the first and second diamond layers from the first and second sacrificial layers to produce free standing, single crystal diamonds.

4. The method as defined by claim 3 wherein separating comprises using a wet etch to etch away at least a portion of the first material.

5. The method as defined by claim 1 further comprising:
epitaxially forming a third sacrificial layer on the second diamond layer, the third sacrificial layer having the first material composition;
epitaxially forming a third diamond layer on the third sacrificial layer, the third diamond layer being a material that is different from the first material composition.

6. The method as defined by claim 1 wherein the first material composition comprises iridium, titanium, or both iridium and titanium.

7. The method as defined by claim 1 wherein the base comprises one or more of magnesium oxide, iridium, silicon, silicon carbide, or diamond.

8. The method as defined by claim 1 wherein the first and second sacrificial layers are a single crystal.

9. The method as defined by claim 1 wherein epitaxially forming the first sacrificial layer comprises using atomic-layer deposition, physical vapor deposition, and/or chemical vapor deposition.

10. The method as defined by claim 1 wherein the first diamond layer has a thickness of between about 10 and 1000 microns.

11. The method as defined by claim 1 further comprising providing a substrate holder, providing the base comprising providing the base within the substrate holder, the substrate holder limiting the width of the epitaxially formed diamond layers.

12. The heteroepitaxial super-lattice formed by claim 1.

13. A heteroepitaxial super-lattice comprising:
a first sacrificial layer on a base comprising a base material composition, the first sacrificial layer epitaxially formed using the crystal structure of the base and having a first material composition;
a first diamond layer on the first sacrificial layer, the first diamond layer epitaxially formed using the crystal structure of the first sacrificial layer and being a material that is different from the first material composition;
a second sacrificial layer on the first diamond layer, the second sacrificial layer having the first material composition; and
a second diamond layer on the second sacrificial layer, the second diamond layer being a material that is different from the first material composition,
wherein the first diamond layer is sufficiently thick to function as a free-standing rigid substrate and/or wafer after separating from the sacrificial layer.

14. The heteroepitaxial super-lattice as defined by claim 13 wherein the base is a single crystal material.

15. The heteroepitaxial super-lattice as defined claim 13 wherein the first diamond layer has a thickness of between about 10 and 1000 microns.

16. The heteroepitaxial super-lattice as defined by claim 13 wherein the base comprises one or more of magnesium oxide, iridium, silicon, silicon carbide, or diamond.

17. The heteroepitaxial super-lattice as defined by claim 13 wherein the first material composition comprises iridium, titanium, or both iridium and titanium.

18. The heteroepitaxial super-lattice as defined by claim 13 further comprising a substrate holder having a recess, the base, first sacrificial layer and first diamond layer being within the recess of the substrate holder, the substrate holder limiting the width of the epitaxially formed diamond layers.

19. A method of forming a plurality of diamonds, the method comprising:
providing a substrate holder with a cavity containing a base, the base comprising a base material composition;
epitaxially forming a first sacrificial layer on the base and within the cavity, the first sacrificial layer having a first material composition;
epitaxially forming a first diamond layer on the first sacrificial layer within the cavity, the first diamond layer being a material that is different from the first material composition;
epitaxially forming a second sacrificial layer on the first diamond layer within the cavity, the second sacrificial layer being the first material composition; and
epitaxially forming a second diamond layer on the second sacrificial layer within the cavity, the first sacrificial layer, the first diamond layer, the second sacrificial layer, and the second diamond layer being part of a heteroepitaxial super-lattice, wherein the first diamond layer is configured to be separable from the first sacrificial layer.

20. The method as defined by claim 19 wherein said providing a base comprises forming a base within the cavity of the substrate holder.

21. The method as defined by claim 19 wherein said providing a base comprises receiving a base already formed within the cavity of the substrate holder.

22. The method as defined by claim 19 further comprising separating the first and second diamond layers from the first and second sacrificial layers to produce free standing, single crystal diamonds, said separating comprising at least partially removing one or both the first and second sacrificial layers from the super-lattice.

* * * * *